US006343113B1

(12) United States Patent
Shu

(10) Patent No.: US 6,343,113 B1
(45) Date of Patent: Jan. 29, 2002

(54) HIGH IMPEDANCE ABSOLUTE TELEPHONE LINE VOLTAGE MEASUREMENT CIRCUIT

(75) Inventor: Linmei Shu, Marion, IN (US)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/215,476

(22) Filed: Dec. 18, 1998

Related U.S. Application Data

(60) Provisional application No. 60/107,099, filed on Nov. 5, 1998.

(51) Int. Cl.[7] .............................. H04M 1/24

(52) U.S. Cl. .............................. 379/24; 379/1.01; 379/21; 379/22.07; 379/27.01; 327/354

(58) Field of Search .............................. 379/1, 6, 9, 10, 379/22, 27, 29, 30; 327/113, 354

(56) References Cited

U.S. PATENT DOCUMENTS 4,518,877 A * 5/1985 Hearn et al. ................ 307/490
5,194,821 A * 3/1993 Brambilla et al. ............ 330/51
5,404,388 A * 4/1995 Eu .............................. 379/27
5,465,287 A * 11/1995 Egozi ............................ 379/5
5,771,285 A 6/1998 Wittman ...................... 379/37
5,881,130 A * 4/1999 Zhang .......................... 379/6

* cited by examiner

*Primary Examiner*—Binh Tieu
(74) *Attorney, Agent, or Firm*—Joseph S. Tripoli; Robert D. Shedd; Frank Y. Liao

(57) ABSTRACT

A telephone line measurement circuit is disclosed for detecting a variation of a characteristic between a first and a second leads of a telephone line. The circuit comprises a first circuit having a first and a second inputs and an output. The circuit also has a second circuit having a first and a second inputs and an output. The first input of the first circuit and the second input of the second circuit are coupled to the first lead of the telephone line and the second input of the first circuit and the first input of the second circuit are coupled to the second lead of the telephone line. The outputs of the first and the second circuits are then coupled together to provide an output for the measurement circuit.

4 Claims, 2 Drawing Sheets

THE ABOVE CIRCUIT

HIGH IMPEDANCE ABSOLUTE TELEPHONE LINE VOLTAGE MEASUREMENT CIRCUIT

This non-provisional application claims the benefit of U.S. Provisional Application, bearing Application No. 60/107,099, filed on Nov. 5, 1998, via U.S. Express Mail No. EL213822249US, bearing the same Title.

FIELD OF THE INVENTION

The present invention generally relates to a telephone line interface circuit. More particularly, the present invention relates to measuring a characteristic of a telephone line.

BACKGROUND OF THE INVENTION

It is well know in telephony that the status of a telephone line may be determined by monitoring the voltage present between the T and R leads of the telephone line. For example, when a telephone connected to a telephone line is picked up (i.e., off hook), the line voltage will typically drop substantially. However, as more and more extension telephones connected to the same telephone line are picked up, the line voltage will drop only incrementally, beyond the initial substantial drop associated with picking up the first telephone.

SUMMARY OF THE INVENTION

The present inventor recognizes the importance of accurately measuring the telephone line voltage in order to provide the correct status of the telephone line. It is especially important to be able to precisely measure a small incremental voltage drop when an extension telephone phone is lifted off hook, in order to effectively implement, for example, a “remote hold release” feature in a KUS-less (Key Service Unit-less; i.e., system without a key service unit), multi-line telephone system 10 shown in FIG. 1. The remote hold release feature is the capability of a telephone in such a system to drop the telephone’s connection automatically, when the telephone detects that the same telephone line is being picked up via a remote handset.

As an example, to use this feature, a user may first answer a telephone call from line 1 (as indicated by wire pair T1 and R1 in FIG. 1) using a handset 1. In some instances, however, the user may have to go to another desk, where handset 2 may be located, for example, to look up some other information. The user will then place handset 1 on hold and walk to the location of handset 2 to pick up line 1 again. Once handset 1 detects that handset 2 has been used to pick up line 1 at the remote location, handset 1 will automatically release itself from line 1. Therefore, an accurate line measurement circuit is needed to effectively determine when additional telephones are lifted off hook in order to implement the remote hold release feature as described above.

The present inventor also recognizes the problem of designing a telephone line measurement circuit to accommodate different polarities of the voltage present on a telephone line from one central office system to another. That is, on some systems, the potential on the T lead may be more positive than on the R lead, and vice versa. In addition, a person may inadvertently reverse the T and R leads during an installation process.

In addition, the present inventor recognizes the importance of providing a high impedance and high resolution measurement circuit which is capable of detecting only a small voltage change on the telephone line. This is particularly important, as described above, for a multi-line telephone systems to implement various features.

Therefore, a telephone line measurement circuit for detecting a variation of a characteristic between a first and a second leads of a telephone line is described, comprising:

a first circuit having a first input and a second input and an output;

a second circuit, identical to said first circuit, having a first input and a second input and an output; wherein said first input of said first circuit and said second input of said second circuit are coupled to said first lead of said telephone line and said second input of said first circuit and said first input of said second circuit are coupled to said second lead of said telephone line, and said outputs are coupled together.

DETAILED DESCRIPTION OF THE DRAWINGS

Figure 1:
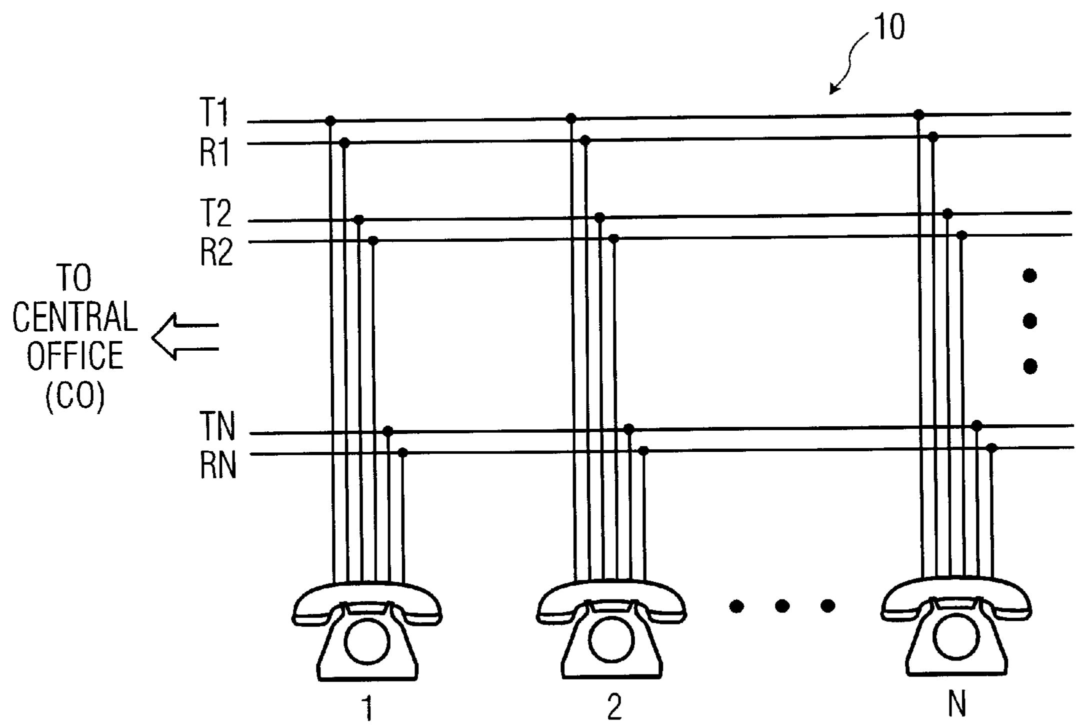
FIG. 1 shows an exemplary configuration of a multi-line KSU-less, multi-handset telephone system.

As described above, FIG. 1 shows a known Key Service Unit (KSU) less multi-line telephone system. In this type of system, each telephone in the system is connected to all the telephone lines supported by the system. For example, telephone 1 is connected to telephone lines 1–N, etc., as shown in FIG. 1. The architecture of this system is different than, for example, a Private Branch Exchange (PBX) system, where each handset is connected to a central switch in a star configuration.

Figure 2:
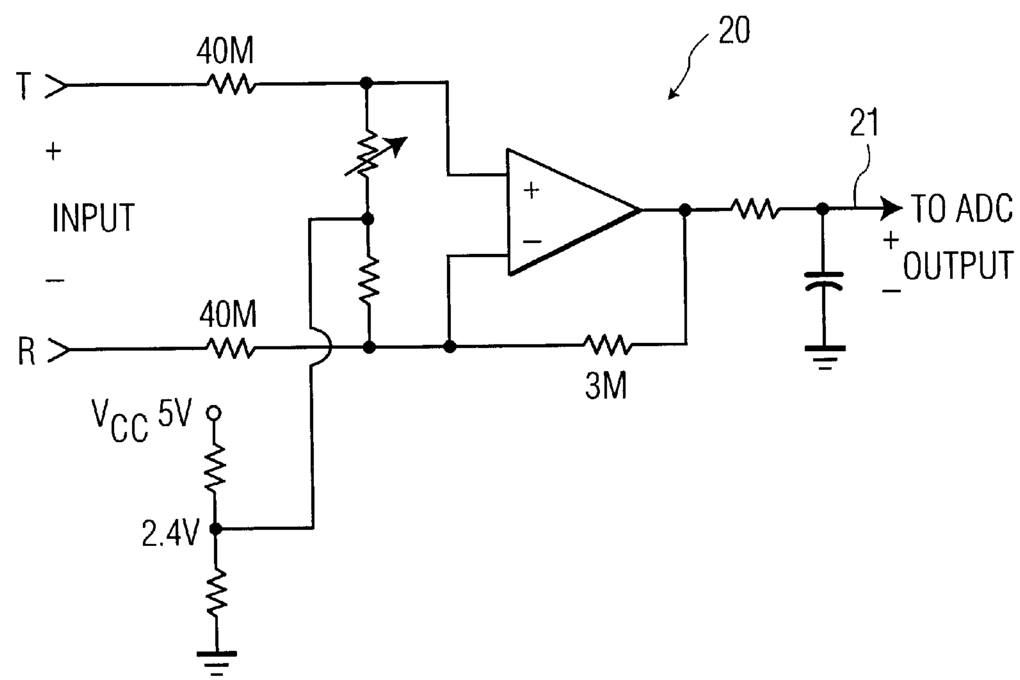
FIG. 2 shows a previously known circuit for measuring a telephone line voltage.
Figure 3:
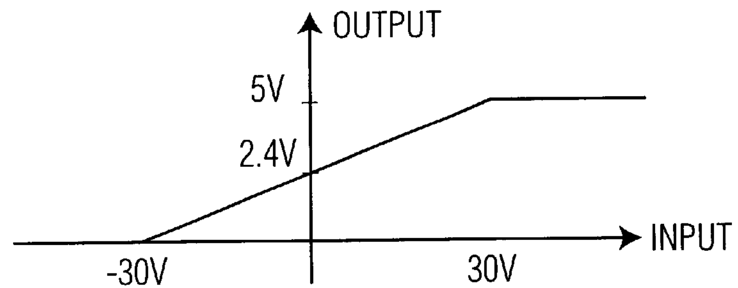
FIG. 3 shows the transfer function of the previously known circuit shown in FIG. 2 in response to varying line voltage input.

FIG. 2 shows a previously known circuit employing a single differential amplifier for measuring and monitoring the Tip and Ring voltage of a telephone line. As illustrated in FIG. 3, the voltage between the Tip and Ring leads of a typical telephone line may vary between 0 to 30 volts, however, the polarity of the voltage may change as a result of different central office system or improper installation, as discussed above. Thus, the possible range of the line input voltage is actually –30 to +30 volts as shown along the x-axis of FIG. 3. With this input range, the output of this circuit will vary linearly from approximately 0 to 5 volts, as shown along the y-axis of FIG. 3. In other words, for a 30 volt change in input voltage (i.e., –30 v to 0 v, or 0 v to 30 v), the output changes over a 2.5 range. The output of this circuit is typically connected to an A to D conversion circuit (not shown) so that the converted digital values may be monitored by a microprocessor (not shown).

Figure 4:
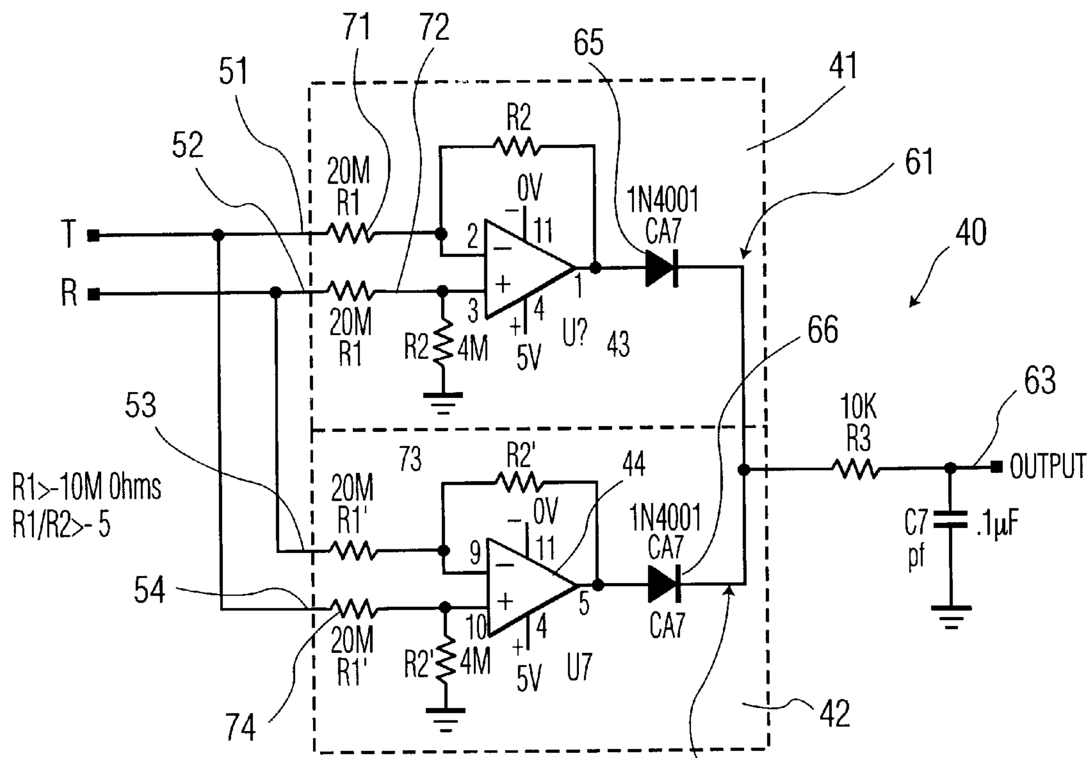
FIG. 4 shows an exemplary embodiment of the present invention.

FIG. 4 shows an exemplary embodiment of the present invention for detecting a variation of a characteristic (for example, potential difference) between a first and a second leads of a telephone line. The exemplary measurement circuit 40 has a first differential amplifier circuit 41 having an operational amplifier (op. amp.) 43. The negative input 51 of this first differential amplifier circuit 41 is coupled to the T lead of a telephone line, while the positive input 52 is coupled to the R lead of the telephone line. The values of the input resistors 71 and 72 (coupled between the T and R leads and the inputs of op. amp. 43) are chosen to provide high impedance characteristic. As configured, the transfer function of the differential circuit 41 is determined by the equation:

$$V\text{out } \mathbf{61}=(R\mathbf{2}/R\mathbf{1})(T-R).$$

The exemplary measurement circuit 40 has additionally a second differential amplifier circuit 42 which is identical to circuit 41. The second circuit 42 has a positive input 54 which corresponds to the positive input 52 of circuit 41 and a negative input 53 which corresponds to the negative input 51 of circuit 41. The T and R leads of the telephone line, however, are connected to the inputs of this second circuit 42 in reversed order from that of circuit 41. That is, the T lead of the telephone line is instead coupled to the positive input 54 of this second circuit 42 and, likewise, the R lead of the telephone line is instead coupled to the negative input 53 of this second circuit 42. Therefore, the transfer function of this differential circuit 42 is determined by the equation:

$$V\text{out } \mathbf{62}=(R\mathbf{2}'/R\mathbf{1}')(R-T).$$

The two outputs 61 and 62 of the first circuit 41 and second circuit 42 are coupled together through protection diodes 65 and 66, respectively. The diodes 65 and 66 provide protection to the respective outputs of the amplifiers, when the other op. amp. is operational. Output 63 of the exemplary circuit 40 is then coupled to an A to D converter (not shown) to be monitored by a microprocessor (not shown) to determine the status of the telephone line, for example.

Figure 5:
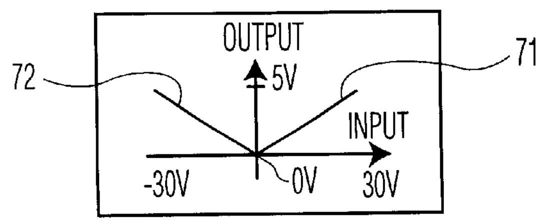
FIG. 5 shows the transfer function of the circuit shown in FIG. 4 in response to varying line voltage input.

The operation of the exemplary circuit 40 may be understood with the aid of the corresponding transfer function of the circuit 40, shown in FIG. 5. For example, if the potential on the T lead is more positive than that on the R lead, then circuit 41 is operational. This results in output 63 having a range of approximately 0 to 5 volts, as the input voltage (T–R) varies from 0–30 volts, shown as line 71 of FIG. 5. On the other hand, if the potential on the T lead is more negative than that on the R lead, then circuit 42 is operational. This results in output 63 having a range of approximately 0 to 5 volts, as the input varies from 0 volts to –30 volt, shown as line 72 of FIG. 5.

The present circuit, therefore, provides an absolute and symmetrical measurement of the input voltage between T and R. The output changes over a full range of the power supply (e.g., 5 volts) for either an input range of 1) –30 v to 0 v or 2) 0 v to 30 v. This doubles the resolution provided by the prior art circuit shown in FIG. 2, without regard to the relative polarity of the T and R leads, thereby providing increasing accuracy and circuit protection for the telephone system.

The present measuring circuit as described above may be used in any type of telephone handset in different types of telephone systems that requires detection of line voltage for a plurality of purposes. The telephone systems may include and are not limited to: single line telephone, multi-line systems including KUS-less or PBX type systems, wireless telephone systems including cellular systems, etc.

It is to be understood that the embodiments and variations shown and described herein are for illustrations only and that various modifications may be implemented by those skilled in the art without departing from the scope and spirit of the invention.

What is claimed is:

1. A voltage measurement circuit, comprising:

a first op-amp circuit having a non-inverting input, an inverting input and an output;

a second op-amp circuit also having a non-inverting input, an inverting input and an output;

a first input of the measurement circuit being coupled to the inverting input of the first op-amp circuit and the non-inverting input of the second op-amp circuit for receiving a first polarity of an DC input voltage;

a second input of the measurement circuit being coupled to the non-inverting input of the first op-amp circuit and the inverting input of the second op-amp circuit for receiving a second polarity of the DC input voltage; and wherein the output of the first op-amp circuit is coupled to the output of the second-op amp circuit for providing an absolute output of the input DC voltage.

2. The circuit of claim 1 wherein the output of the first op-amp circuit is coupled to the output of the second-op amp circuit through respective diodes.

3. The circuit of claim 1 wherein the first op-amp circuit is identical to the second op-amp circuit.

4. The circuit of claim 1 wherein the input voltage represents a voltage between a pair of telephone line.

* * * * *